(12) United States Patent
Khandros et al.

(10) Patent No.: US 7,675,311 B2
(45) Date of Patent: Mar. 9, 2010

(54) WIRELESS TEST SYSTEM

(75) Inventors: Igor Y. Khandros, Orinda, CA (US); Benjamin N. Eldridge, Danville, CA (US); Charles A. Miller, Fremont, CA (US); A. Nicholas Sporck, Saratoga, CA (US)

(73) Assignee: FormFactor, Inc., Livermore, CA (US)

( * ) Notice: Subject to any disclaimer, the term of this patent is extended or adjusted under 35 U.S.C. 154(b) by 107 days.

(21) Appl. No.: 11/749,004

(22) Filed: May 15, 2007

(65) Prior Publication Data

US 2007/0210822 A1 Sep. 13, 2007

Related U.S. Application Data

(62) Division of application No. 10/690,170, filed on Oct. 21, 2003, now Pat. No. 7,218,094.

(51) Int. Cl.
G01R 31/26 (2006.01)

(52) U.S. Cl. .................................................. 324/765

(58) Field of Classification Search ................ 324/765, 324/763, 760, 158.1, 754, 761–762; 340/870.16, 340/988, 635, 653; 702/119; 264/21; 455/427, 455/430, 12.1, 13, 1, 67.1, 423, 67.11; 701/33, 701/35
See application file for complete search history.

(56) References Cited

U.S. PATENT DOCUMENTS

| | | | |
|---|---|---|---|
| 5,539,325 A | 7/1996 | Rostoker et al. | |
| 5,825,193 A | 10/1998 | Nakata et al. | |
| 6,137,303 A * | 10/2000 | Deckert et al. | 324/765 |
| 6,236,223 B1 * | 5/2001 | Brady et al. | 324/765 |
| 6,246,251 B1 | 6/2001 | Gallagher | |
| 6,600,325 B2 | 7/2003 | Coates et al. | |
| 6,759,863 B2 | 7/2004 | Moore | |
| 6,812,046 B2 | 11/2004 | Drost et al. | |
| 6,885,202 B2 | 4/2005 | Slupsky | |
| 6,975,955 B1 | 12/2005 | Lukindo | |
| 7,057,518 B2 | 6/2006 | Schmidt | |
| 7,202,687 B2 | 4/2007 | Khandros et al. | |
| 7,218,094 B2 | 5/2007 | Khandros et al. | |
| 7,253,651 B2 | 8/2007 | Khandros et al. | |
| 7,466,157 B2 | 12/2008 | Miller | |
| 2007/0182438 A1 | 8/2007 | Khandros et al. | |
| 2007/0271071 A1 | 11/2007 | Khandros et al. | |

FOREIGN PATENT DOCUMENTS

WO 97/33446 9/1997

* cited by examiner

*Primary Examiner*—Ha Tran T Nguyen
*Assistant Examiner*—Tung X Nguyen
(74) *Attorney, Agent, or Firm*—N. Kenneth Burraston

(57) ABSTRACT

One or more testers wirelessly communicate with one or more test stations. The wireless communication may include transmission of test commands and/or test vectors to a test station, resulting in testing of one or more electronic devices at the test station. The wireless communication may also include transmission of test results to a tester. Messages may also be wirelessly exchanged.

18 Claims, 11 Drawing Sheets

WIRELESS TEST SYSTEM

CROSS-REFERENCE TO RELATED APPLICATION(S)

This application is a divisional of U.S. patent application Ser. no. 10/690,170, filed Oct. 21, 2003 (now U.S. Pat. No. 7,218,094).

BACKGROUND

Although this invention is generally applicable to test systems and methods in general, it is particularly suited for semiconductor device testing.

As known, semiconductor devices are typically manufactured many at a time as "dice" on a semiconductor wafer, after which the dice are further processed before being shipped to customers or installed in various products. That further processing may take many forms.

In perhaps the most common post-manufacture processing, the dice are probed while still in wafer form and initial testing is performed on each die. Thereafter, the dice are singulated from the wafer, and the dice that passed the initial probe testing are packaged, burned in, and further tested. In another common process, the dice are not packaged after being singulated from the wafer but are further tested and often burned in to produce "known good dice," which are unpackaged dice that have been fully tested. In more advanced processes, the dice are burned in and fully tested while in wafer form. In all of these exemplary post-manufacture processes, as well as other scenarios in which electronic devices of any kind are tested, there is a need to control testing and/or exercising of the dice or other electronic devices.

BRIEF SUMMARY

The present invention relates generally to test systems and methods. In an embodiment of the invention, one or more testers wirelessly communicate with one or more test stations. The wireless communication may include transmission of test commands, test vectors, test results, and/or messages.

DETAILED DESCRIPTION OF EXEMPLARY EMBODIMENTS

The present invention relates generally to test systems and methods. This specification describes exemplary embodiments and applications of the invention. The invention, however, is not limited to these exemplary embodiments and applications or to the manner in which the exemplary embodiments and applications operate or are described herein.

Figure 1:
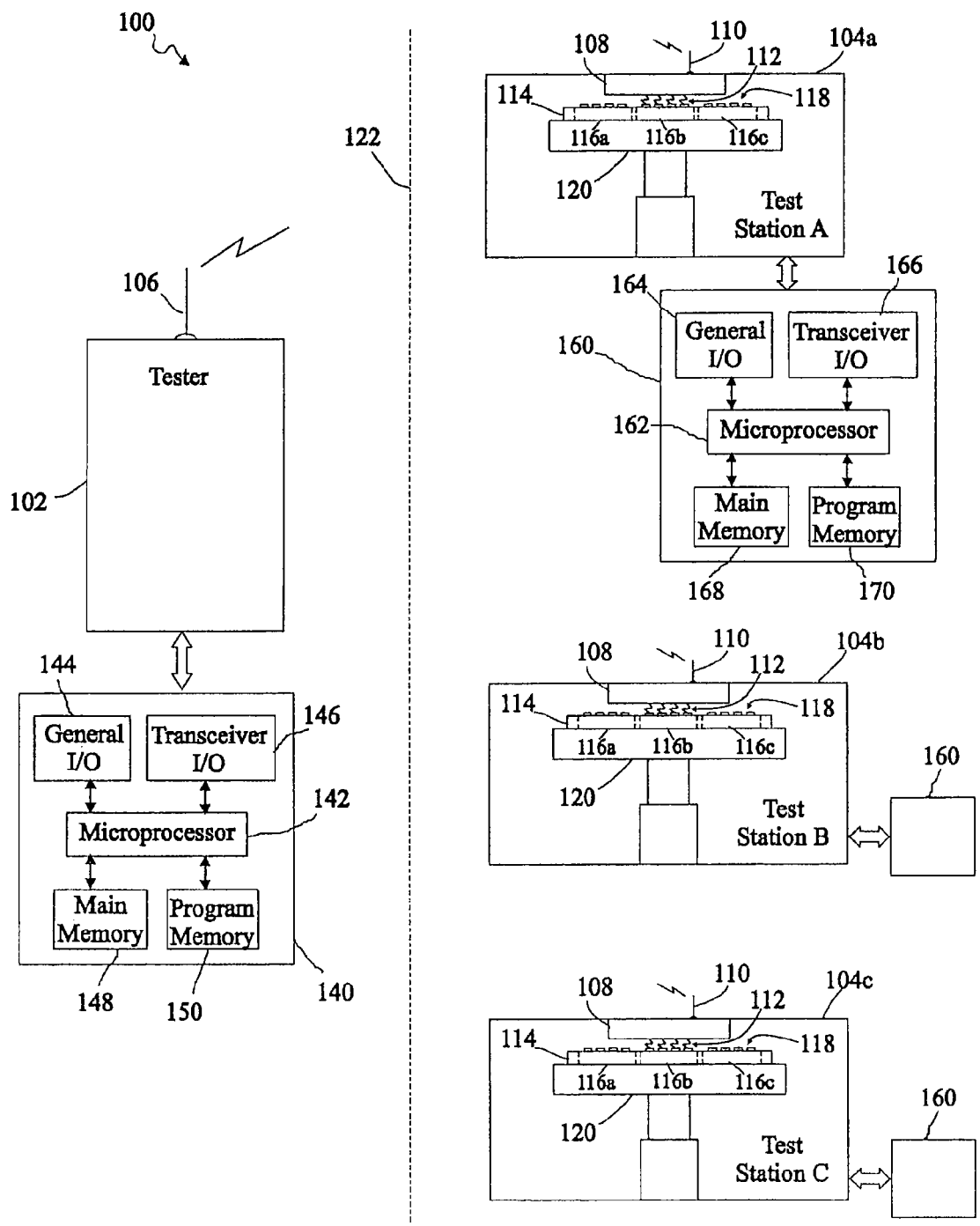
FIG. 1 illustrates a block diagram of major elements of an exemplary test system.

FIG. 1 illustrates an exemplary test system 100. The system 100 includes a tester 102 and three test stations: test station A 104a, test station B 104b, and test station C 104c, although more testers and fewer or more test stations may be used. Tester 102 includes wireless transceiver 106, and test stations 104a-104c also each include a wireless transceiver 110. Optionally, tester 102 may include a microprocessor-based control system 140. A block diagram of the basic components of an exemplary microprocessor-based control system 140 are shown in FIG. 1, which includes a microprocessor 142, a main memory 148, a program memory 150, a general input/output block 144, and a transceiver input/output block 146. Each test station 104a-104c may include a similar microprocessor-based control system 160, with similar elements, including a microprocessor 162, a main memory 168, a program memory 170, a general input/output block 164, and a transceiver input/output block 166.

Test station A 104a, test station B 104b, and test station C 104c each includes one or more electronic devices to be tested. In the example shown in FIG. 1, all of the test stations 104a, 104b, 104c are probers for probing a semiconductor wafer 114 comprising a plurality of dice 116a, 116b, 116c. Thus, the electronic device to be tested in each of test stations 104a-104c is a wafer 114 or more specifically the dice 116a-116c. (Three dice 116a, 116b, 116c per wafer 114 are shown in FIG. 1 for simplicity. Typically, many more dice are fabricated on a wafer.)

As known, such probers typically include a moveable chuck 120, a probe card 108 having probes 112 for contacting pads 118 on one or more of the dice 116a, 116b, 116c. Test stations 104a, 104b, 104c, however, need not be probers but may be any type of apparatus in which an electronic device is tested or exercised. Nonlimiting examples include an apparatus comprising sockets, test probes, or load boards for holding packaged or unpackaged (singulated) semiconductor dice during testing and/or burn in. Another example is an apparatus for testing multi-chip modules. (The term "testing," as used herein, is intended to cover broadly any form of exercising an electronic device that is part of a larger process of determining the usability, functionality, performance, or reliability of the electronic device. Thus, for example, the term "testing" includes exercising a semiconductor device during burn in regardless of whether the device is monitored or analyzed during the exercising.) Tester 102 controls testing of the electronic devices 114.

Transceivers 106 and 110 allow the tester 102 and the test stations 104a-104c to communicate wirelessly. Thus, although tester 102 and test stations 104a-104c may be located near each other, each may be located remotely from the others. Element 122 in FIG. 1 represents an optional physical separation between the tester 102 and the test stations 104a-104c. Thus, tester 102, on one hand, and test stations 104a-104e, on the other hand, may be located in different rooms, different buildings, or even different geographical locations. The wireless link between the tester 102 and each of the test stations 104a-104c may be any type of wireless link, including without limitation any type of optical or radio signal link and may include such intermediate elements as repeaters and/or communication satellites. Indeed, the tester 102 and its transceiver 106 may be remotely located one from another with a communication network, such as a local area network, wide area network, or metropolitan area network or the Internet, between them. Although not shown in FIG. 1, test stations 104a-104c may also be physically separated or located remotely one from another.

Figure 2:
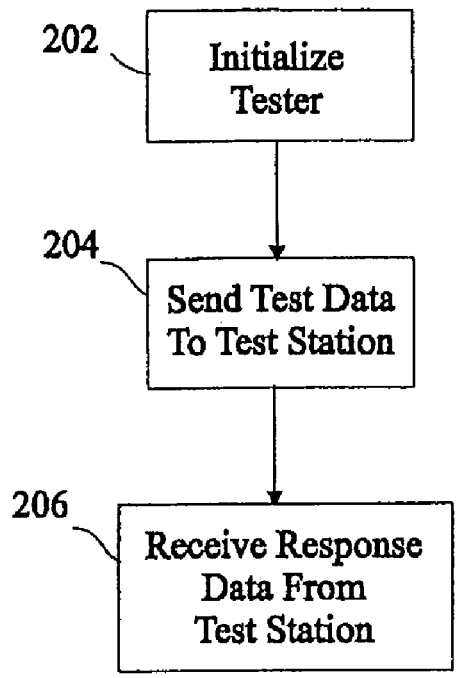
FIG. 2 illustrates an exemplary process that may be run by the controller 140 of FIG. 1.
Figure 3:
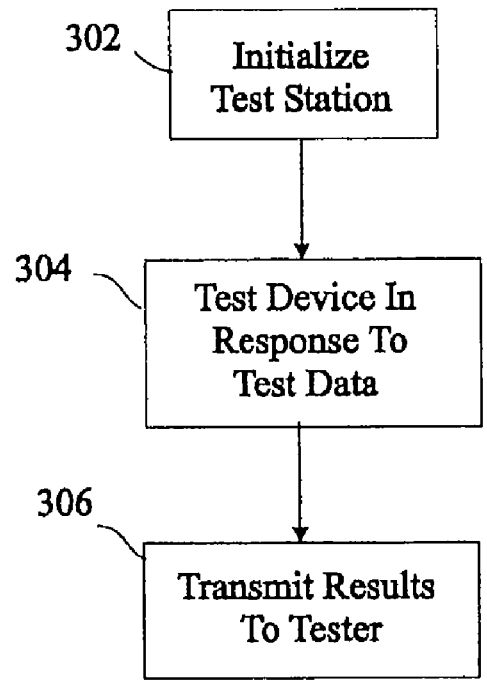
FIG. 3 illustrates an exemplary process that may be run by the controllers 160 of FIG. 1.

FIG. 2 illustrates basic operation of the tester 102, and FIG. 3 illustrates basic operation of a test station 104. (Reference to "104" without specifying "a," "b," or "c" refers to any one or more of the test stations.) At step 202, the tester 102 is initialized, and at step 302 a test station is initialized. At step 204, the tester 102 sends wirelessly test data to a test station 104, and at step 304, the test station 104 tests an electronic device 114 in accordance with the test data. At step 306, the test station 104 transmits wirelessly results of the testing to the tester 102, which is received by the tester at step 206.

As one option, the processes shown in FIG. 2 may be implemented in the tester 102 as software (including firmware or microcode) stored in program memory 150 and executed by microprocessor 142. Similarly, the process illustrated in FIG. 3 may be implemented in a test station 104 as software stored in program memory 170 and executed by microprocessor 162. In the tester 102, data to be transmitted by the transceiver 106 and data received via the transceiver 106 may be output or input through the transceiver input/output block 146. Other data may be input or output through the general input/output block 144. The general input/output block 164 and the transceiver input/output block 166 in a test station's microprocessor-based controller 160 may be generally similar to like elements in the tester's controller 140.

The test data sent by the tester 102 to a test station 104 may be in any format recognizable by the test station. As one example, the test data may be test vectors that include both the data to be written to the electronic device under test 114 and an identification of the probes through which the test data is to be written. In such case, the test station 104 simply places data on the probes as specified by the test vectors. As another example of a format for the test data, the test data may comprise commands that cause a test station 104 to generate test vectors for testing a die 116a-116c. The results data transmitted by a test station 104 back to the tester 102 may likewise be in any format recognizable by the tester 102, which may range from raw data generated by the die 116a-116c to data representing an analysis or summary of the response of the die 116a-116c to the test data.

Figure 4:
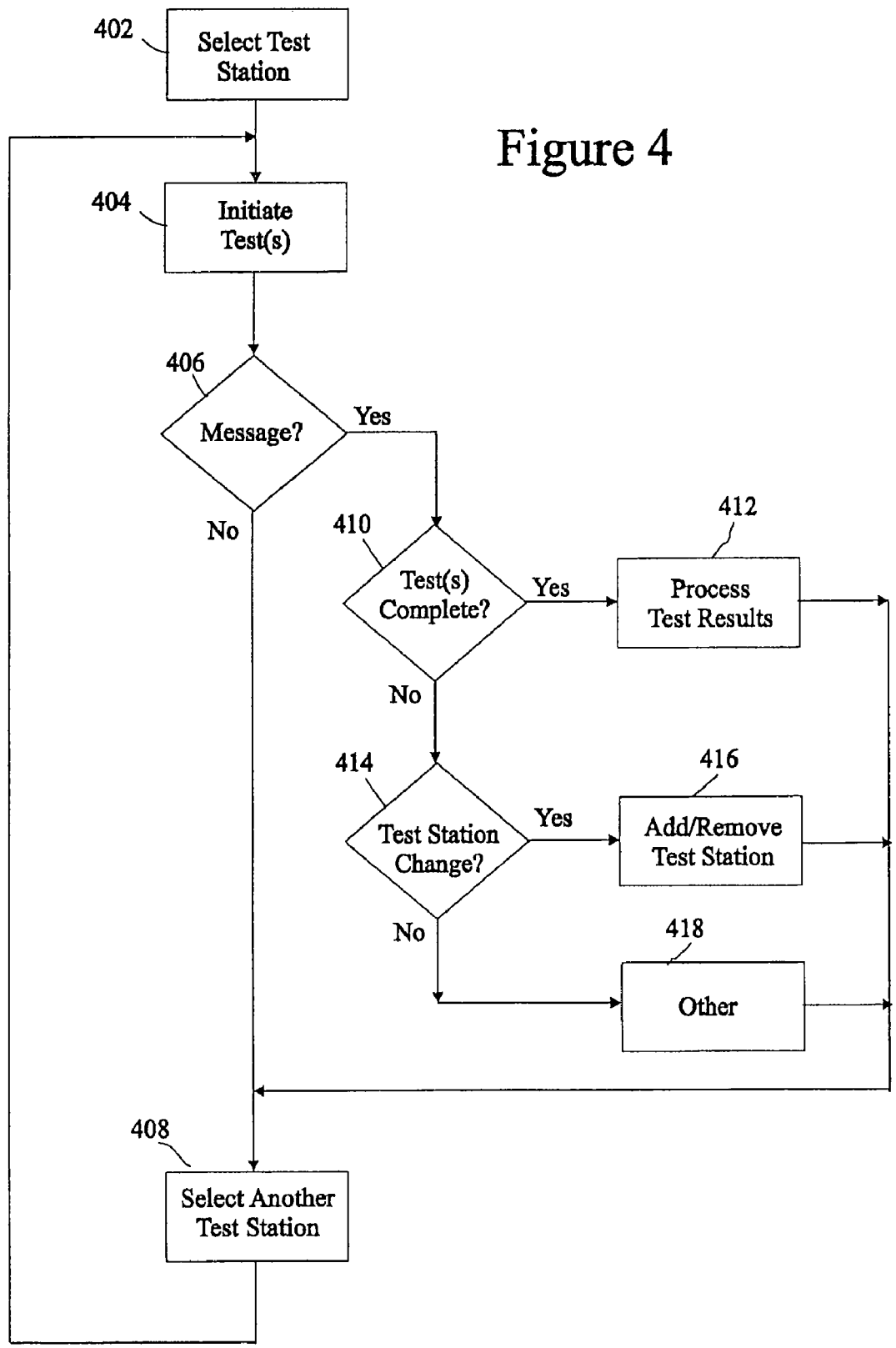
FIG. 4 illustrates an exemplary detailed implementation of steps 204 and 206 of FIG. 2.
Figure 5:
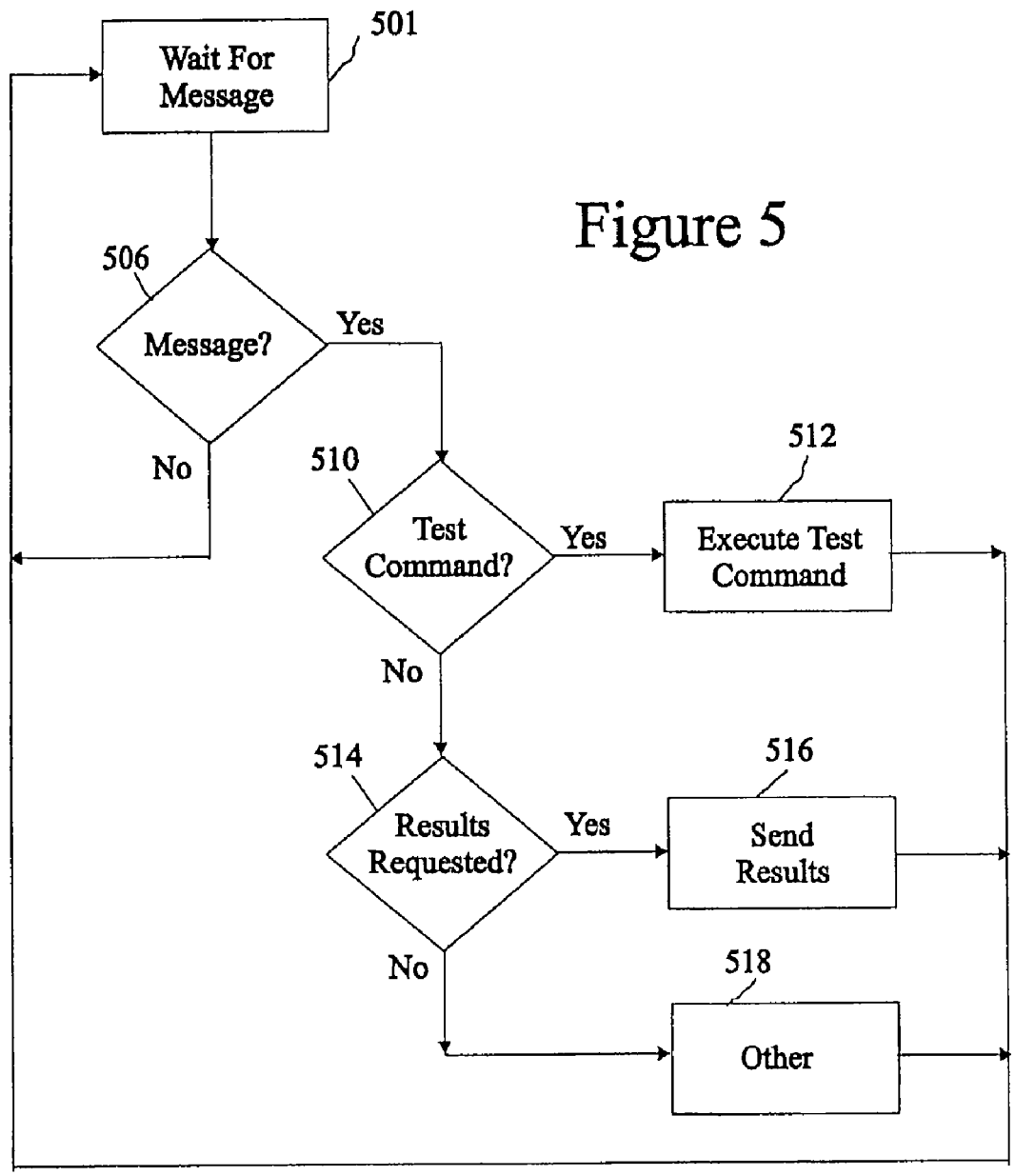
FIG. 5 illustrates an exemplary detailed implementation of steps 304 and 306 of FIG. 3.

FIG. 4 illustrates an exemplary detailed implementation of steps 204 and 206 from FIG. 2, and FIG. 5 illustrates a corresponding implementation of steps 304 and 306 from FIG. 3. The exemplary processes of FIGS. 4 and 5 will be discussed with respect to the test system 100 shown in FIG. 1. As will be seen, the process of FIG. 4 causes the tester 102 to initiate testing at the test stations 104a-104c, after which the tester 102 waits for messages from the test stations 104a-104c indicating that testing is completed. Upon receiving such a message, the tester 102 requests transfer of the test results data.

For purposes of illustration, it will be assumed that test station A 104a and test station B 104b are initialized at step 302 of FIG. 3. This initialization may include such things as loading wafers 114 to be tested into test station A 104a and test station B 104b. Initialization may also include loading data into the main memory 168 of the microprocessor-based control system 160 in each of test station A 104a and test station B 104b. If the test data to be received from the tester 102 comprise test commands, a command table for decoding the commands may also be loaded into the main memory 168 of each of the test stations 104a and 104b. To complete initialization, each test station 104a and 104b sends a request to the tester 102 to be brought on line for testing. The request may include data both identifying the test station and the type of wafer loaded into the test station.

In the mean time, the tester 102 is also initialized at step 202 of FIG. 2. Initialization of the tester 102 may include such things as loading a list of wafer types and tests to be run on each wafer type into the main memory 148 of the microprocessor-based control system 140 in the tester 102. As mentioned above, in this example, it is assumed that the test sequences are defined by one or a series of test commands. To complete initialization, the tester 102 brings all test stations 104 from which a message requesting to be brought on line has been received. This may be done, for example, by creating a list of the test stations to be brought on line and the wafer type in each test station, and storing the list in the main memory 148 of the controller 140 in the tester 102.

After initialization of both the tester 102 and test station A 104a and test station B 104b, the tester 102 is ready to begin executing the process illustrated in FIG. 4, and each on-line test station—test station A 104a and test station B 104b—is ready to begin executing the process shown in FIG. 5. (Note that in this example, test station C 104c was not initialized and brought on line for testing.)

As shown in FIG. 4, the tester 102 selects a test station at step 402. The selected test station may be any of the on-line test stations as listed in the tester's main memory 148. In this example, there are two test stations—test station A 104a and test station B 104b—listed as on-line in the tester's main memory 148, and the tester 102 selects test station A 104a at step 402. At step 404, the tester 102 initiates testing of the wafer 114 in the selected test station 104a. As mentioned above, in this example, the tester 102 does so by transmitting wirelessly to the selected test station—test station A 104a—a test command or a series of test commands. To do so, the tester 102 looks in its main memory 148 at the type of wafer in the selected test station 104a, and then retrieves, also from its main memory 148, the test command or series of test commands for that wafer type. The test command or commands define the test(s) to be performed on the dice of that wafer type. Step 404 may also include setting a flag in the tester's main memory 148 indicating that testing is underway in the selected tester 104a.

After initiating testing at the selected test station 104a at step 404, the tester 102 determines at step 406 whether it has received any messages. If not, the tester selects another of the on-line testers at step 408. The tester 102 may do so by searching the list of on-line test stations in the tester's main memory 148 for a test station where testing is neither underway nor completed. In this example, the tester 102 selects test station B 104b at step 408 and then repeats step 404, initiating testing in the newly selected test station B 104b by wirelessly transmitting a test command or series of test commands, as described above. In this example, there are only two test stations on line—test station A 104a, and test station B 104b.

In other examples involving more on-line test stations, this process would continue to be repeated.

During this process, if a message is received, execution branches at 406 so that the message is decoded and any necessary action taken. If the message is from a test station 116a-116c indicating that testing at that test station 104 has completed (see step 410), then the tester 102 processes the results of the testing at step 412. Processing the test results (step 412) may include such things as sending a message to the test station requesting transmission of the test results. (Alternatively, if the test results were transmitted with the message from the test station, the tester 102 reads the test results from an internal buffer (not shown).) Step 412 may also include additional actions, such as setting a flag in the tester's main memory 148 indicating that testing has completed at that test station. If, as shown in FIG. 1, the test station contacts less than all of the dice 116a-116c on the wafer 114 being tested, step 412 may include causing the test station to reposition the wafer 114 to contact an as yet untested die or dice. After processing the test results at step 412, the process of FIG. 4 repeats step 408 of selecting a new test station, from which the process beginning with step 404 is repeated as necessary to initiate testing at the test stations.

If the message detected at step 406 was a request from a new test station to be brought on line or a request from an on-line test station to be taken off line (see step 414), then the new test station is brought on line at step 416 or the on-line test station is brought off line at step 416. Bringing a new test station on line may include such things as adding the new test station's identifier and wafer type to the list of on-line test stations stored in the tester's main memory 148. Likewise, taking an on-line test station off line may include such things as deleting the test station's identifier and wafer type from the same list.

In the example being discussed, only test station A 104a and test station B 104b were brought on line. While testing is occurring at those two test stations 104a, 104b, an operator may initialize test station C 104c by, among other things, loading a wafer 114 into test station C 104c. Test station C 104c may then send a request to the tester 102 to be brought on line. As discussed above, the tester 102 will then bring test station C 104c on line at step 416 of FIG. 4. Once on line, test station C 104c will eventually be selected at step 408 and tests initiated at step 404.

As mentioned above, FIG. 5 illustrates operation of each of the test stations 104 in response to messages sent by the tester 102 during operation of the process shown in FIG. 4. As also mentioned above, FIG. 5 illustrates an exemplary detailed implementation of steps 304 and 306 of FIG. 3 and is therefore executed after the initialization step 302 of FIG. 3. As shown in FIG. 5, each on-line test station 104 waits for a message at step 501. If a message containing a test command is received from the tester 102 (see steps 506, 510), then the test command is executed at step 512. The test command may be executed, for example, by finding the test command in a decode table stored in the test station's main memory 168 and taking the actions indicating in the decode table for the test command. As just one example, the decode table may contain a test vector or vectors that are to be written to the wafer 114. As another example, the test station 104 may generate commands that are sent to the dice 116a-116c and executed by self test circuitry on the dice (e.g., so called built-in-self-test circuitry). Execution of the test command may also include buffering the response data generated by the die being tested and sending a message to the tester 102 that testing is completed and response data is ready. If the message was a request from the tester 102 to send test results for testing that has completed (see step 514), then the test results (which may be buffered at the test station 104) are transmitted wirelessly to the tester at step 516. Alternatively, the test results may be stored and/or analyzed solely at the test station, and the results may be retrieved by other than the tester 102—e.g., an operator—from the test station 104.

Step 418 in FIG. 4 and step 518 in FIG. 5 illustrate other miscellaneous actions that may be taken by the tester 102 or a test station 104. Such other actions may include ending the process, handling errors, etc. In addition, provisions may be made in each process for processing multiple messages. These and other modifications and additions to the processes shown in FIGS. 4 and 5 are within the skill of the ordinary practitioner in the field and need not be discussed.

Figure 6:
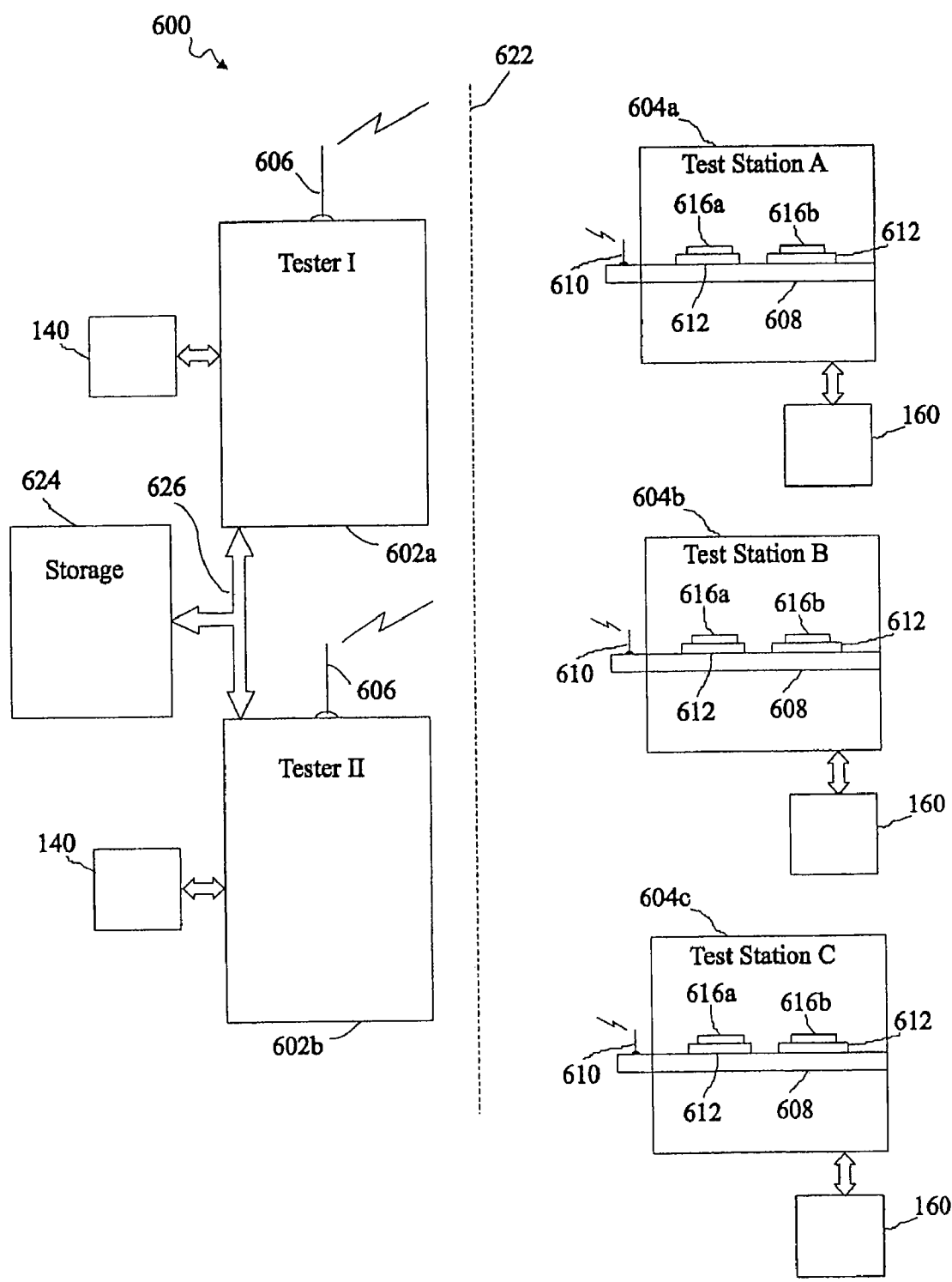
FIG. 6 illustrates a block diagram of major elements of another exemplary test system.

FIG. 6 illustrates another exemplary test system 600. As shown, test system 600 also includes three test stations: test station A 604a, test station B 104b, and test station C 104c, although fewer or more could be used. In this example, each test station 604a-604c includes a load board 608 with sockets 612 for receiving singulated dice 616a, 616b. Each load board also includes a transceiver 610 and internal wiring (not shown) for carrying test signals and response data to and from the dice 616a, 616b. Each test station 604a-604c also includes a controller 160, which may be generally similar to controller 160 discussed above with respect to FIG. 1.

Test system 600 also includes two testers: tester I 602a and tester II 602b. Again, however, fewer or more testers may be used. Each tester 602 includes a transceiver 606 and a controller 140, which may also be generally similar to controller 140 discussed above with respect to FIG. 1. A communication link 626 interconnects tester I 602a and tester II 602b and also connects to storage unit 624. Communication link 626 may be any type of electronic communication device, including without limitation a cable, a wireless link, a computer network, etc. Like 122 in FIG. 1, element 622 represents optional physical separation.

In this example, tester I 602a causes a first functional test (test 1) to be performed on the dice 616a, 616b, and tester II 602b causes a second functional test (test 2) to be performed on the same dice. Thus, full testing of the dice 616a, 616b, in this example, includes both test 1 and test 2. For example, test 1 may be a fast functional test, and test 2 may be a longer, more exacting functional test. More than two sequential tests may be run on the dice 116a, 116b, and such tests could include exercise during burn in.

The processes shown in FIGS. 2 and 3 may also be run on the testers 602a, 602b and test stations 604a-604c of FIG. 6. That is, the process shown in FIG. 2 may be run on each of the testers 602a, 602b, and the process shown in FIG. 3 may be run on each of the test stations 604a-604c.

Figure 7:
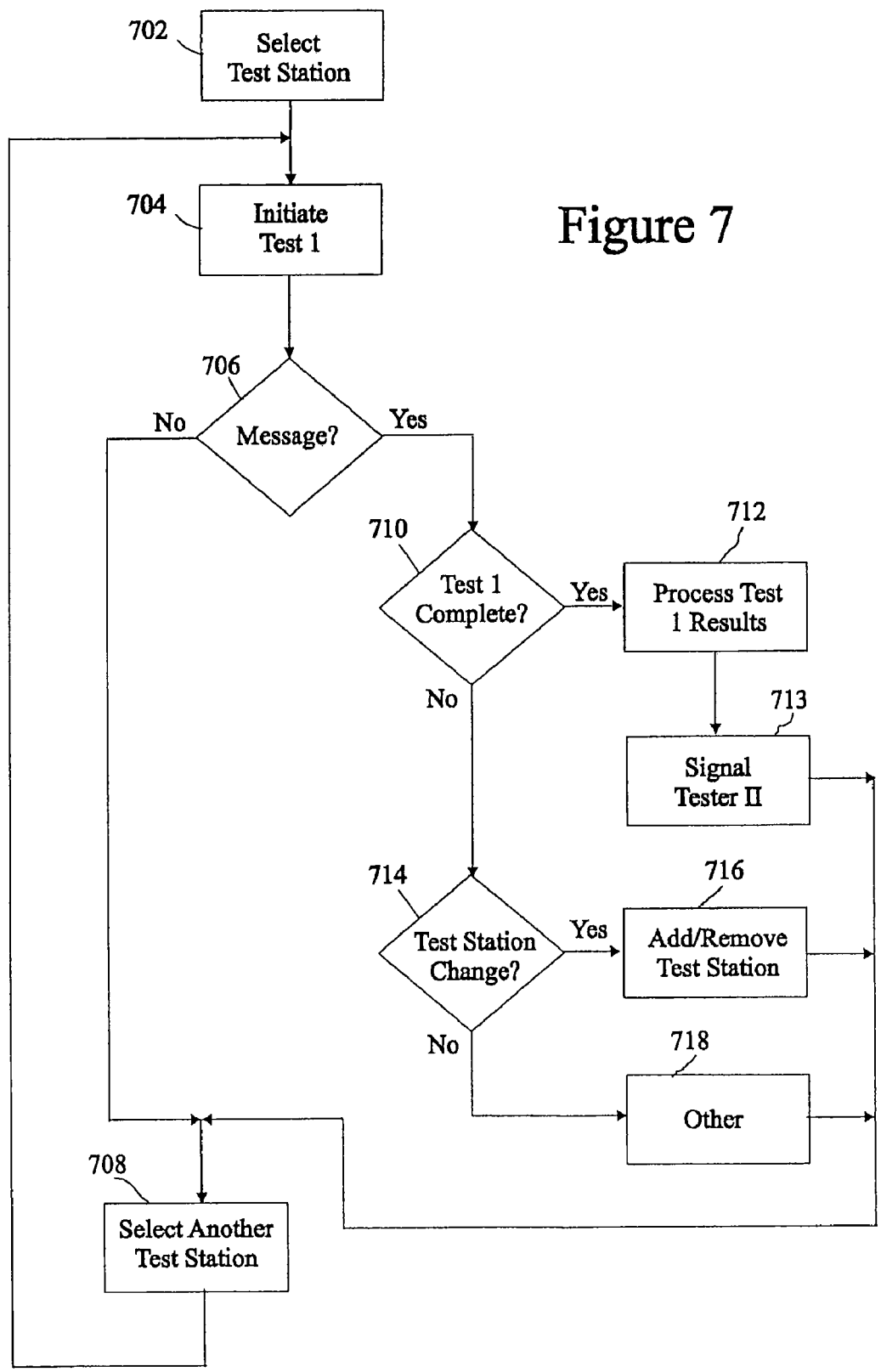
FIG. 7 illustrates an exemplary detailed implementation of steps 204 and 206 of FIG. 2 run on the controller 140 of Tester I in FIG. 6.
Figure 8:
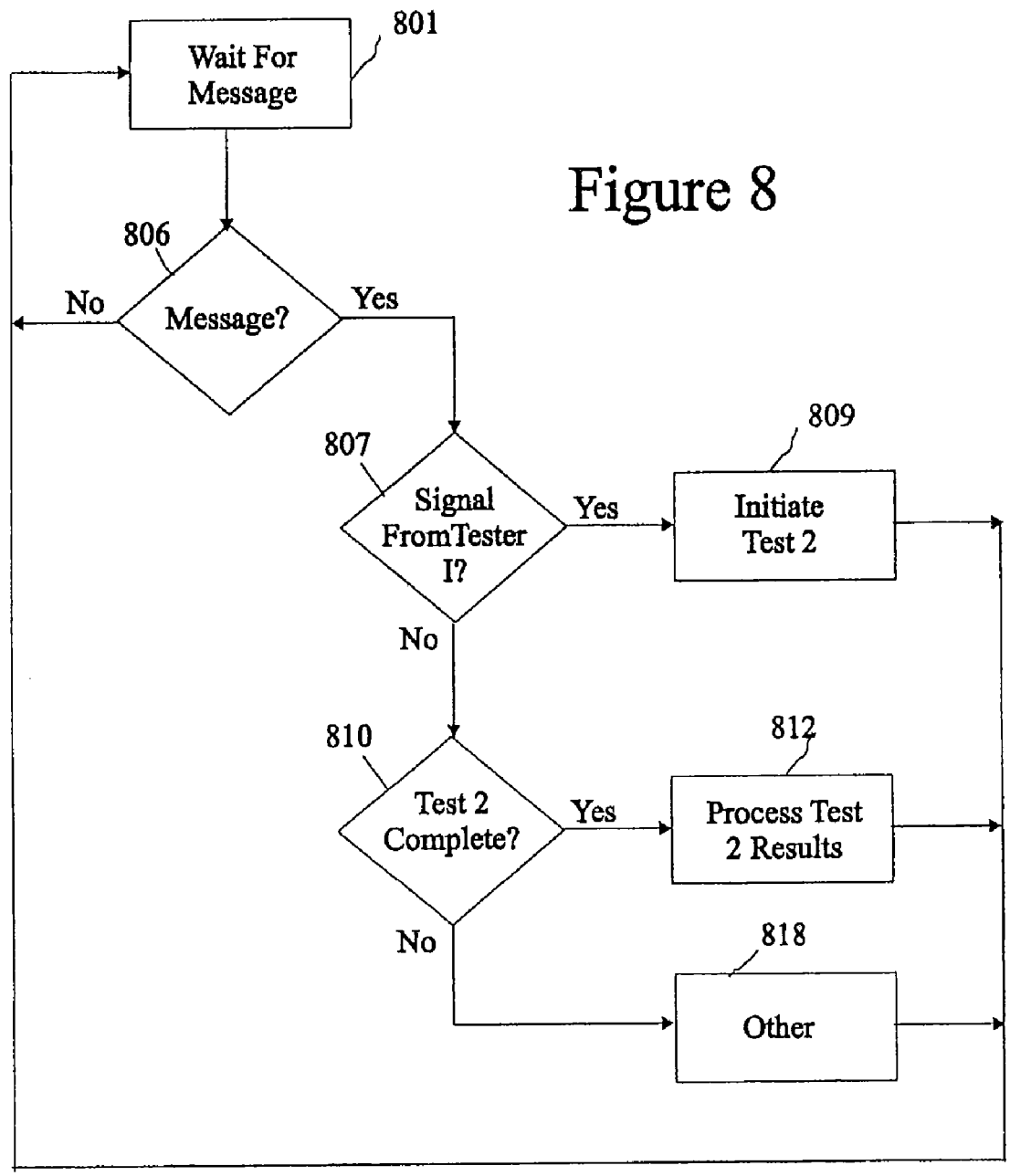
FIG. 8 illustrates an exemplary detailed implementation of steps 204 and 206 of FIG. 2 run on the controller 140 of Tester II in FIG. 6.

FIGS. 7 and 8 illustrate an exemplary detailed implementation of steps 204 and 206 from FIG. 2 that may be run on tester I 602a and tester II 602b, respectively. The process of FIG. 5, discussed above, may be implemented on each of the test stations 604a-604c. As will be seen, in the process of FIG. 7, tester I 602a initiates a first test (test 1) at the test stations 604a-604c, after which tester I 602a waits for a message from each test station indicating that test 1 has completed at that test station. Upon receiving such a message from a particular test station, tester I 602a requests transfer of the results of test 1 from that particular test station, and tester I 602a sends a message to tester II 602b indicating that test 1 has completed at that test station. Upon receiving this message from tester I 602a, tester II 602b initiates test 2 at that particular test station, and then waits for a message from that test station that test 2 has been completed, after which tester 2 602b requests the results of test 2 from the test station. Both testers 602*a*, 602*b* may store the results of the tests in the storage device 624.

For purposes of illustration, it will be assumed that test station A 604*a*, test station B 604*b*, and test station C 604*c* are all initialized at step 302 of FIG. 3. This initialization may be generally similar to the initialization of test station A 104*a* and test station B 104*b* of FIG. 1 as described above with respect to FIGS. 3-5. For example, initialization of test station A 604*a*, test station B, 604*b*, and test station C 604*c* may include such things as securing dice to be tested 616*a*, 616*b* to load boards 608, and placing a load board in each test station. Initialization data may also be loaded into the main memory 168 of the microprocessor-based control system 160 in each test station 604*a*-604*c*. If the test data to be received from the testers 602*a*, 602*b* comprise commands, a command table for decoding the commands may also be loaded into the main memory 168 of each of the test stations 604*a*-604*c*. To complete initialization, each test station 604*a*-604*c* sends a request to tester I 602*a* to be brought on line for testing. The request may include data both identifying the test station and the type of dice to be tested at the test station.

In the mean time, tester I 602*a* and tester II 602*b* are also initialized at step 202 of FIG. 2. Initialization of the testers 602*a*, 602*b* may also be similar to the initialization of tester 102 described above with respect to FIGS. 2, 4, and 5. For example, initialization in each tester 602*a*, 602*b* may include such things as loading a list of dice types and test sequences to be run on each dice type into the main memory 148 of the microprocessor-based control system 140 in each tester 602*a*, 602*b*. As mentioned above, in this example, it is assumed that the test sequences are defined by one or a series of test commands. To complete initialization, tester I 602*a* brings on line all test stations from which a message requesting to be brought on line has been received. This may be done, for example, by creating a list of the test stations to be brought on line and the dice type in each test station, and storing the list in the main memory 148 of the microprocessor-based control system 140 in tester I 602*a*.

After initialization of the testers 602*a*, 602*b* and the test stations 604*a*-604*c*, tester I 602*a* is ready to begin executing the process illustrated in FIG. 7; tester II 602*b* is ready to begin executing the process illustrated in FIG. 8; and each on-line test station—test station A 604*a*, test station B, 604*b*, and test station C 604*c*—is ready to begin executing the process shown in FIG. 5.

As shown in FIG. 7, tester I 602*a* selects a test station at step 702. The selected test station may be any of the on-line test stations listed in the main memory 148 of tester I 602*a*. For illustration purposes in this example, there are three test stations—test station A 604*a*, test station B 604*b*, and test station C 604*c*—listed as on-line in the main memory 168 of tester I 602*a*, and tester I 602*a* selects test station A 604*a* at step 702. At step 704, tester I 702 initiates test 1 on the dice 616*a*, 616*b* at the selected test station—test station A 604*a*. As mentioned above, in this example, tester I 602*a* does so by transmitting wirelessly the selected test station 604*a* one or a series of test commands that define test 1. Step 704 may also include setting a flag in the main memory 148 of Tester I 602*a* indicating that testing is underway at the selected test station—test station A 604*a*.

After initiating test 1 at the selected test station—test station A 604*a*—at step 704, tester I 602*a* determines at step 706 whether it has received any messages. If not, tester I 602*a* selects another of the on-line testers at step 708, which may be accomplished generally as described above with respect to FIG. 4. In this example, tester I 602*a* selects test station B 604*b* at step 708 and then repeats step 704, initiating test 1 on the dice 616*a*, 616*b* in the newly selected test station, which is now test station B 604*b*.

In this example, it is assumed that test station A 604*a* completes test 1 and sends a message indicating as much to tester I 602*a* shortly after tester I 602*a* initiates test 1 at test station B 604*b*. Thus, at the next pass through the process of FIG. 7, a message is detected at step 706, causing the process of FIG. 7 to branch to step 710. Because the message indicates that test 1 has completed at test station A 602*a*, the process of FIG. 7 branches to step 712, where tester I 602*a* processes the results of test 1 in test station 602*a*. Processing the results of test 1 (step 712) may include such things as sending a message to the test station requesting transmission of the results of test 1. (Alternatively, if the test results were transmitted with the message from the test station, tester I 602*a* reads the test results from an internal buffer (not shown).) Step 712 may also include additional actions, such as setting a flag in the main memory 148 of tester I 602*a* indicating that test 1 has been completed at that test station.

After processing at step 712 the test results of test 1 executed at test station A 604*a*, the process of FIG. 7 sends a message to tester II 602*b* indicating that test 1 has completed at test station A (see step 713). As will be seen, this causes tester II 602*b* to initiate test 2 at test station A 604*a*. Thereafter, tester I 602*a* repeats step 708 and selects this time test station C 604*c* and repeats the process shown in FIG. 7 at step 704, initiating test 1 at test station C 604*c*.

Referring now to FIG. 8, which illustrates exemplary operation of tester II 602*b*, after initialization at step 202 of FIG. 2 (as discussed above), tester II 602*b* waits for a message at step 801. Upon receiving the message from tester I 602*a* that test 1 has completed at test station A 604*a* (see step 713 of FIG. 7, as discussed above), tester II 602*b* takes the "yes" branches at steps 806 and 807 of FIG. 8. At step 809, tester II 602*b* initiates test 2 at test station A 604*a*. Tester II 602*b* does so by wirelessly sending to test station A 604A a command or series of commands that define test 2. As test 1 finishes in each of the remaining test stations B 604*b* and C 604*c*, tester I 602*a* processes the results of test 1 at those test stations at step 712 of FIG. 7 and sends a message at step 713 of FIG. 7 to tester II 602*b*, indicating that test 1 has completed at each of those test stations. Tester II 602*b* then initiates test 2 in each of those test stations, per steps 806, 807, 809 of FIG. 8. As test 2 completes at each of the test stations 604*a*-604*c*, each test station sends a message to tester II 604*b*. In response to each such message, tester II 604*b* processes the results of test 2 at that particular test station, per steps 806, 810, 812 of FIG. 8. The step of processing test results at step 812 may be generally similar to step 412 of FIG. 4 and step 712 of FIG. 7.

During these processes, a new test station may send a message to tester I 602*a* requesting to be brought on line. Likewise, an on-line test station may send a message to tester I 602*a* requesting to be taken office line. Such requests are processed by tester I 602*a* at steps 714, 716 of FIG. 7, and may be accomplished in a manner generally similar to step 416 of FIG. 4 as described above. As just one example, when test 2 completes in test station A 602*a*, an operator may cause test station A 602*a* to be taken off line, replace the now fully tested dice 116*a*, 116*b* with new dice to be tested, and cause test station A 602*a* to be brought back on line, now as a new test station with dice to be tested. This may be accomplished by causing test station A 604*a* to send tester I 602*a* a message requesting to be taken off line, and then after loading a new wafer 114 to be tested into test station A 604*a*, causing test station A to send tester I 602*a* a message requesting to be brought on line.

It should be apparent that testers may also be brought on and off line. By strategically bringing testers and test stations on and off line as needed, a test system may be balanced for maximum data through put between tester and test stations and maximum testing efficiency.

Step 718 in FIG. 7 and step 818 in FIG. 8 illustrate other miscellaneous actions that may be taken by tester I 602a and tester II 602b, which may be generally similar to miscellaneous actions described above with respect to FIGS. 4 and 5.

Figure 9:
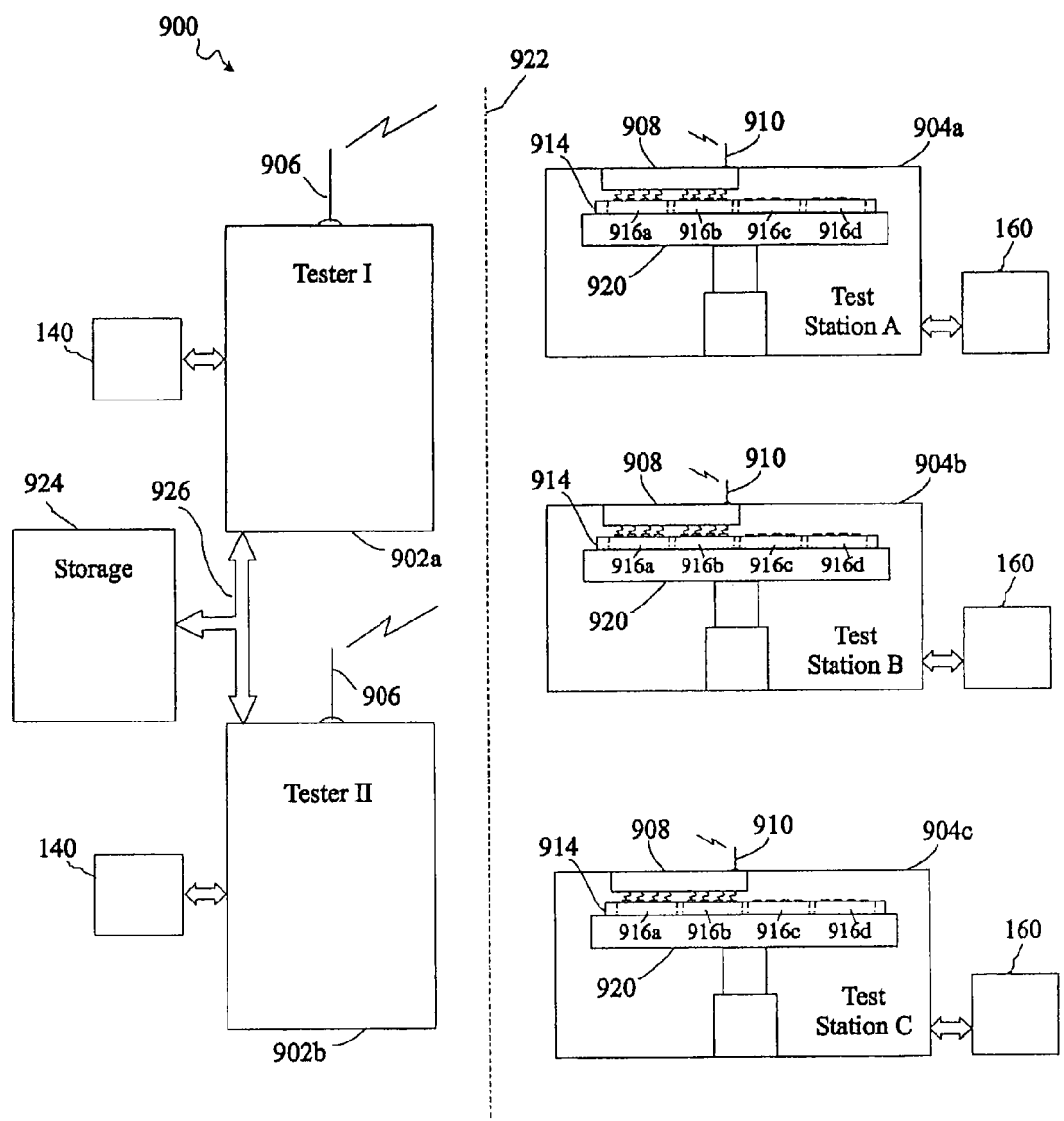
FIG. 9 illustrates a block diagram of major elements of yet another exemplary test system.

FIG. 9 illustrates another exemplary test system 900. Test system 900 also includes three test stations: test station A 904a, test station B 904b, and test station C 904c, although fewer or more may be used. In this example, each test station 904a-904c is a prober for probing an unsingulated semiconductor wafer 914 comprising a plurality of dice 916a-916d. (Again, four dice 916a-916d are shown for ease of illustration, but more or fewer may be present.) Such probers may be similar to the probers discussed above with respect to FIG. 1 and may include such things as a probe card 908 with probes 912 for contacting pads 918 on wafer 914 and a chuck 920 for holding and moving wafer 914. Each test station 904a-904c also includes a transceiver 910 and a controller 160, which may be generally similar to transceiver 910 and a controller 160 as in FIG. 1.

Test system 900 also includes two testers: tester I 902a and tester II 902b. Each tester includes a transceiver 906 and a controller 140, which may also be generally similar to controller 140 discussed above with respect to FIG. 1. Similar to FIG. 6, a communication link 926 interconnects tester I 902a and tester II 902b and also connects to storage unit 924. As discussed above with respect to FIG. 6, communication link 926 may be any type of electronic communication link. Like element 122 in FIG. 1 and element 622 in FIG. 6 (both discussed above), element 922 represents an optional physical separation. In this example, probe card 908 is capable of contacting two dice at one time. Probe card 908 is shown in FIG. 9 contacting dice 916a, 916b. Often a probe card will contact more than two dice, but two dice are shown in FIG. 9 for ease of illustration.

In this example, rather than send test data in the form of test commands, Tester I 902a and Tester II 902b send test vectors to test stations 904a-904c. For purposes of this example, it is assume that neither tester 902a, 902b has sufficient bandwidth to send enough test vectors to test both die 916a and die 916b at the same time. As will be seen, Tester I and Tester II both send the same test vectors to a particular test station 904. The test station 904 uses test vectors from one tester to test one of the dice and test vectors from the other tester to test the other die.

The general process shown in FIG. 2 may also be run on the I 902a and tester II 902b of the test system 900 shown in FIG. 9, and the general process shown in FIG. 3 may be run on test station A 904a, test station B 904b, and test station C 904c.

Figure 10:
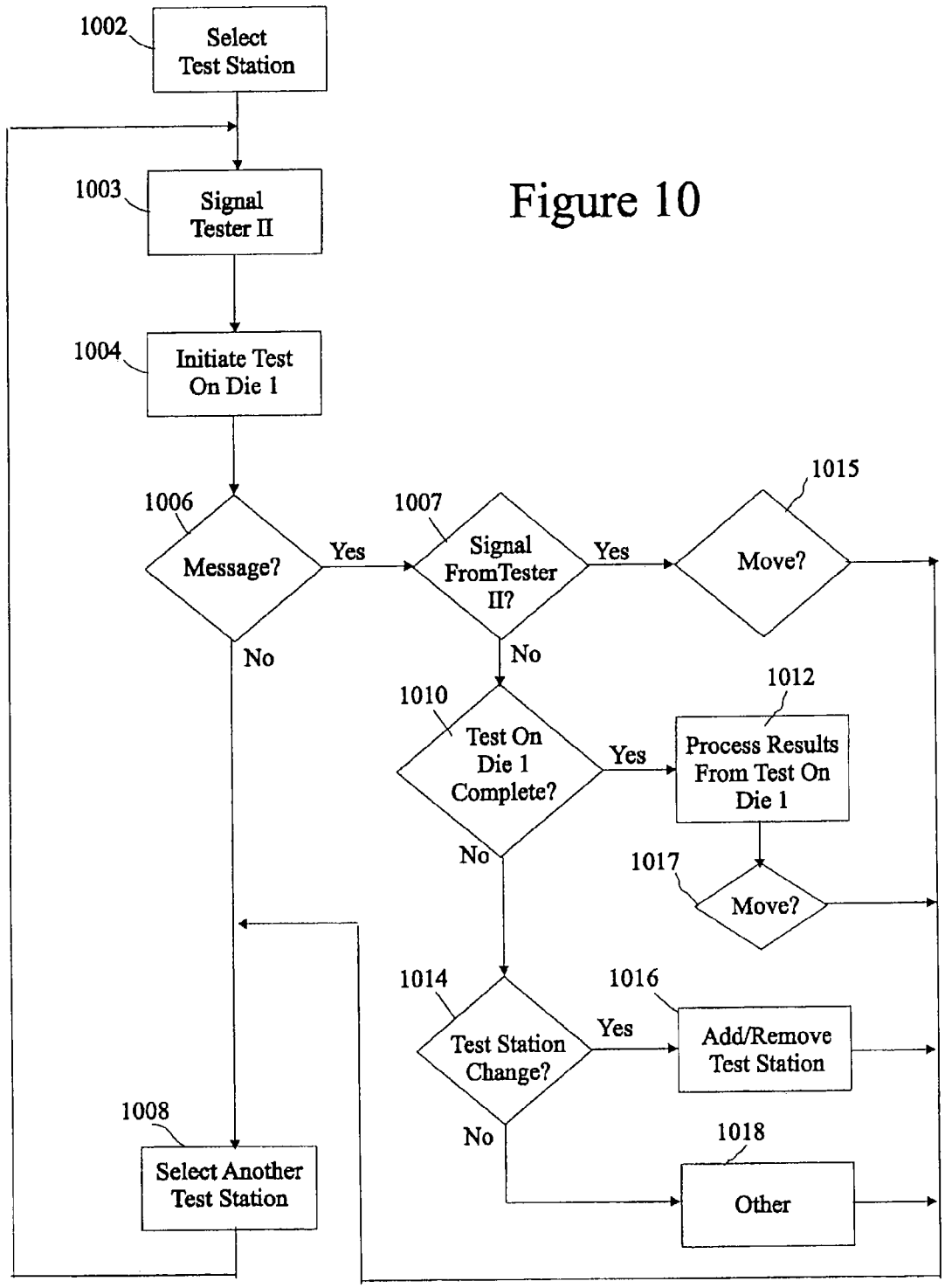
FIG. 10 illustrates an exemplary detailed implementation of steps 204 and 206 of FIG. 2 run on the controller 140 of Tester I in FIG. 9.
Figure 11:
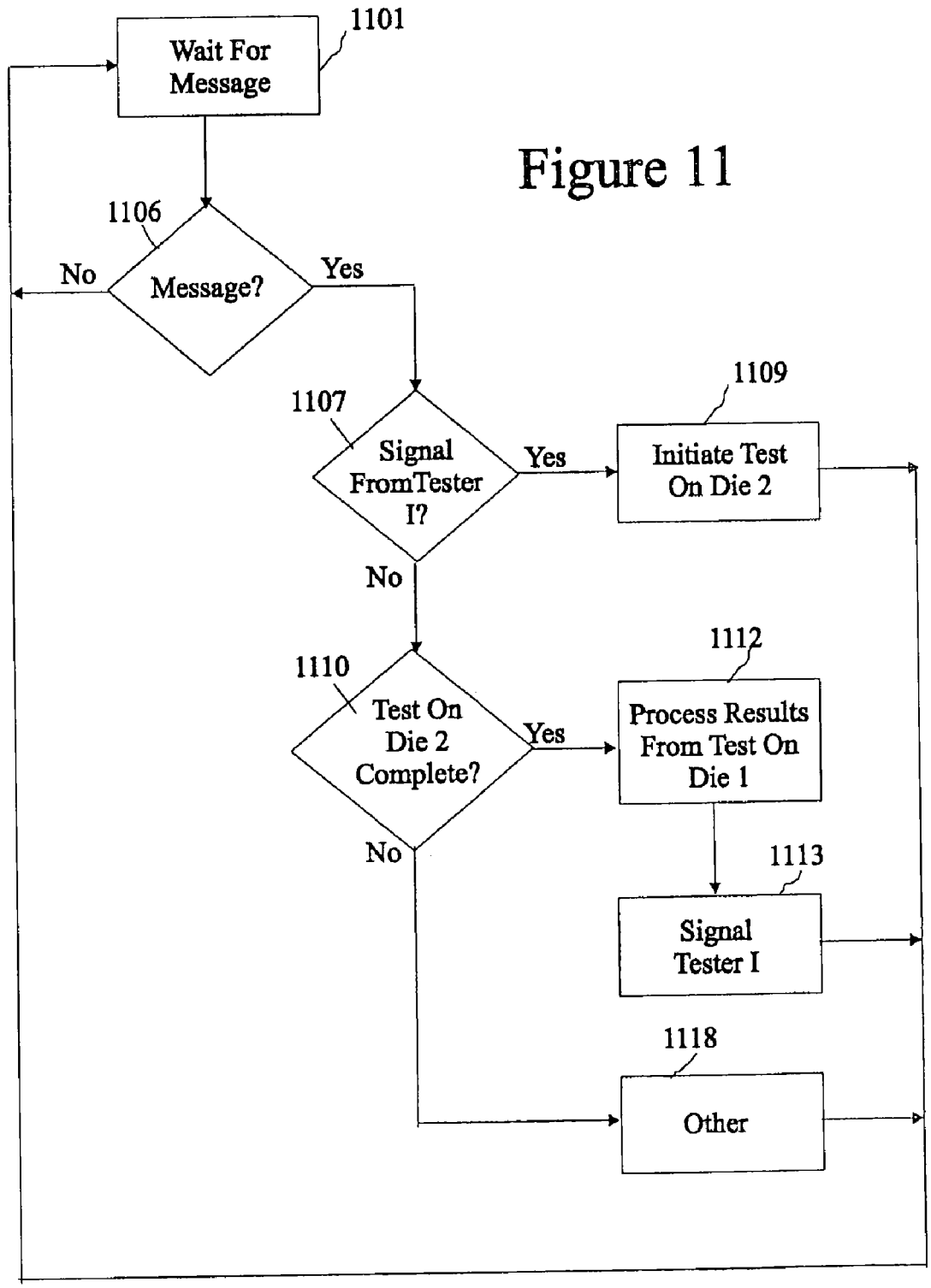
FIG. 11 illustrates an exemplary detailed implementation of steps 204 and 206 of FIG. 2 run on the controller 140 of Tester II in FIG. 9.
Figure 12:
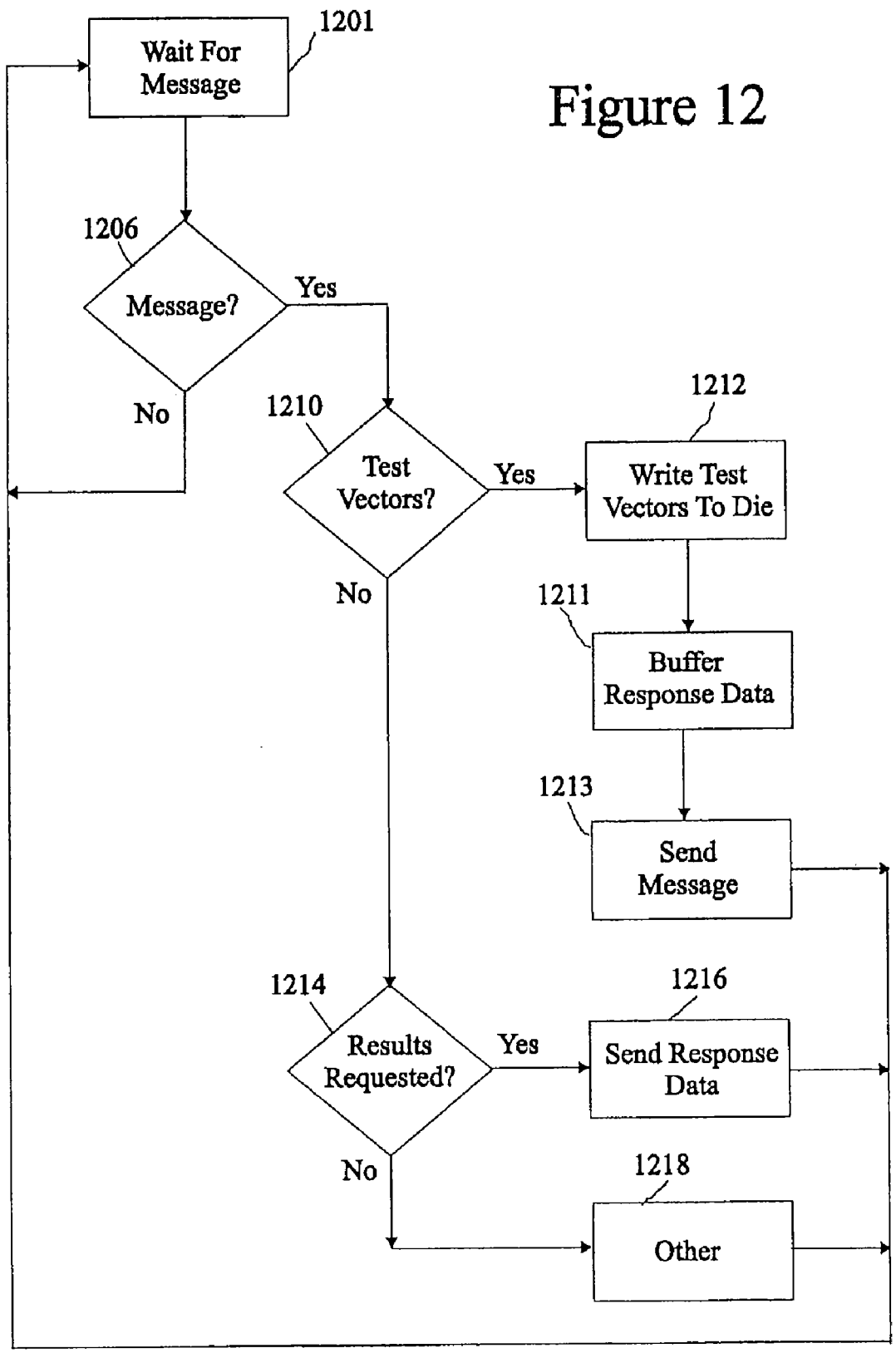
FIG. 12 illustrates an exemplary detailed implementation of steps 304 and 306 of FIG. 2 run on the controllers 160 in FIG. 9.

FIG. 10 illustrates an exemplary detailed implementation of steps 204 and 206 from FIG. 2 that may be run in tester I 902a, and FIG. 11 illustrates an exemplary detailed implementation of steps 204 and 206 from FIG. 2 that may be run in tester II 902b. FIG. 12 illustrates an exemplary detailed implementation of steps 304 and 306 from FIG. 3 that may be run in each of test station A 904a, test station B 904b, and test station C 904c. As will be seen, in the processes of FIGS. 10 and 11, tester I 902a selects a test station having a wafer in need of testing and sends a message to tester II 902b. Tester I 902a then initiates testing of die 1 916a at the selected test station, and tester II 902b initiates testing of die 2 916b at the selected tester. Tester I 902a then continues to select test stations with wafers in need of testing, after which both testers continue to initiate testing of the dice at the selected test stations. As the various tests are completed, both testers collect the test results and store the results in the storage device 924. The testers 902a, 902b communication with the test stations 904a, 904b, 904c wirelessly.

Again, for purposes of illustration, it will be assumed that test station A 904a, test station B 904b, and test station C 904c are initialized at step 302 of FIG. 3. This initialization may be generally similar to the initialization of test stations 104a and 104b described above with respect to FIGS. 3-5. To complete initialization, each of test station A 904a, test station B 904b, and test station C 904c sends a request to tester I 902a to be brought on line for testing. The request may include data both identifying the test station and the type of wafer loaded into the test station.

In the mean time, tester I 902a and tester II 902b are also initialized at step 202 of FIG. 2. Initialization of the testers 902a, 902b may also be similar to the initialization of tester 102 described above with respect to FIGS. 2, 4, and 5. To complete initialization, tester I 902a brings on line all test stations from which a message requesting to be brought on line has been received. This may be done, for example, by creating a list of the test stations to be brought on line and the wafer type in each test station, and storing the list in the main memory 148 of the microprocessor-based control system 140 of tester I 902a.

After initialization of the testers 902a, 902b and the test stations 904a-904c, tester I 902a is ready to begin executing the process illustrated in FIG. 10; tester II 902b is ready to begin executing the process illustrated in FIG. 11; and each on-line test station 904a-904c is read to begin executing the process shown in FIG. 12.

As shown in FIG. 10, tester I 902a selects a test station at step 1002. The selected test station may be any of the on-line test stations as listed in the main memory 148 of tester I 902a. For purposes of this example, all three of the test stations— test station A 904a, test station B 904b, and test station C 904c—are listed as on-line in the main memory 148 of tester I 902a, and tester I 902a selects test station A 904a at step 1002. At step 1003, tester I 902a sends a message to tester II 902b that test station A 904a is selected. Thereafter, at step 1004, tester I 902a initiates testing on the first die 916a of wafer 914 in test station A 904a. In this example, tester I 902a does so by transmitting wirelessly one or more test vectors to test station A 904a. Step 1004 may also include setting a flag in the main memory 148 of tester I 902a indicating that testing is underway at the selected test station—test station A 904a.

After initiating testing of die 1 916a of wafer 914 at the selected test station 904a at step 1004, tester I 902a determines at step 1006 whether it has received any messages. If not, tester I 902a selects another of the on-line testers at step 1008, which may be accomplished generally as described above with respect to FIG. 4. In this example, tester I 902a selects test station B 904b at step 1008. Tester I 902a then repeats the process of FIG. 10 beginning at step 1003. That is, tester I 902a sends a message to tester II 902b that test station B 904b is now selected, and tester I 902a initiates testing of die 1 916a of wafer 914 at the new selected test station—test station B 904b. As this process continues, tester I 902a initiates testing of die 1 916a of all of the wafers 914 in each of the on-line test stations 904, and tester I 902a sends a message to tester II 902b each time one of the test stations is selected.

Referring now to FIG. 11, after initialization, tester II 902b waits for messages at step 1101. In response to a message sent by tester I 902a at step 1003 of FIG. 10 identifying a selected test station, tester II 902b initiates testing of die 2 916b of the wafer 914 at the selected test station at step 1109. Like tester I 902a, in this example, tester II 902b initiates testing of die 2 916b by wirelessly transmitting one or more test vectors to the selected test station.

As should be apparent, the operation of the process of FIG. 10 in tester I 902a and the process of FIG. 11 in tester II 902b results in the roughly simultaneous initiation of testing of die 1 916a (by tester I 902a) and die 2 916b (by tester II 902b) of the wafer 914 at the selected test station.

Referring now to FIG. 12, after initialization, each test station 904a-904c waits for messages at step 1201. Upon receiving test vectors from one of the testers 902 (sent by tester I 902a at step 1004 of FIG. 10 or tester II 902b at step 1109 of FIG. 11), the test station 904 writes the test vectors through the probes 912 of probe card 908 (see steps 1206, 1210, 1212). If the test vectors were received from tester I 902a, the test station 904 writes the test vectors to die 1 916a; if the tester vectors were received from tester II 902b, the test station 904 writes the test vectors to die 2 916b. Preferably, the test vectors include both test data and an identification of the probes 912 through which the test data is to be written. The test station 904 then collects response data produced by the dice in response to the test vectors and buffers the response data at step 1211. The test station 904 then sends a message at step 1213 to the tester 902 from which the test vectors were received indicating that the tests are completed.

Referring again to FIG. 10, tester I 902a, upon receiving a message from a test station 904 indicating that testing has completed (see steps 1006, 1010), processes the results of the testing at step 1012, which may include such things as sending a message to the test station 904 requesting transmission of the test results. In this example, wafer 914 must be moved after testing dice 916a, 916b to contact and test dice 916c, 916d. At step 1017, if tester I 902a has received an indication from tester II 902b that testing of die 2 916b has been completed, tester I 902a causes the test station 904 to move the wafer 914 to contact and test dice 916c, 916d.

Referring now to FIG. 11, tester II 902b, upon receiving a message from a test station 904 indicating that the testing has completed (see steps 1106, 1110), tester II 902b processes the results of the testing at step 1112, which may include such things as sending a message to the test station requesting transmission of the test results. At step 1113, tester II 902b sends a message to tester I 902a that testing of die 2 916b has been completed. Referring now to FIG. 10, upon receiving such a message from tester II 902b, tester I 902a causes the test station 904 to move the wafer 914 to contact and test dice 916c, 916d if testing of die 1 916a has been completed. (See steps 1007, 1015.)

Referring again to FIG. 12, a test station 904 that receives a message from one of the testers 902a, 902b requesting the results of testing sends the test results to the tester 902 at step 1216 (see also steps 1206, 1214). Element 1218, labeled "other," in FIG. 12 represents other tasks that might be performed by a test station 904. Moving the wafer in response to a command from tester I 902a (as discussed above) is an example of such a task. A message originating from any number of possible sources stopping the process of FIG. 12 is another example. Stopping the process and other miscellaneous tasks may be performed at step 1018 in FIG. 10 and 1118 in FIG. 11.

As with other processes described above, a new test station may send a messages to tester I 902a requesting to be brought on line. Likewise, an on-line test station may send a message to tester I 902a requesting to be taken office line. Such requests are processed by tester I 902a at steps 1014, 1016 of FIG. 10, and may be accomplished in a manner generally similar to step 416 of FIG. 4 as described above.

As mentioned previously, the processes illustrated in FIGS. 2-5, 7, 8, and 10-12 are exemplary only and not to be taken as limiting. Similarly, the systems shown in FIGS. 1, 6, and 9 are exemplary only and not to be taken as limiting.

It should be apparent that, in all of the processes illustrated in FIGS. 4, 6, and 10, provisions may be made for by passing steps 408, 608, and 1008 if no new test stations are available. Such provisions are, however, well within the skill of a person of ordinary skill in the field and need not be discussed. Similarly, provisions for processing error conditions, exiting the processes illustrated in FIGS. 2-5, 7, 8, and 10-12, or processing multiple messages are well within the skill of a person of ordinary skill in the field and also need not be discussed.

Note that probe cards, such as probe card 108 in FIG. 1 and probe card 908 in FIG. 9, are often capable of contacting many more than one die at a time. Thus, die 116b in FIG. 1 may represent a plurality of dice being contacted by probe card 108. Likewise, each of dice 916a and 916b in FIG. 9 may represent a plurality of dice being contacted by probe card 908.

Although specific embodiments and applications of the invention have been described in this specification, there is no intention that the invention be limited to these exemplary embodiments and applications or to the manner in which the exemplary embodiments and applications operate or are described herein.

The invention claimed is:

1. A tester comprising:
    initiating means for wirelessly initiating testing of an electronic device only at an on-line test station;
    receiving means for wirelessly receiving results of said testing from said on-line test station;
    means for wirelessly receiving a request from an off-line test station to be become an on-line test station; and
    adding means for bringing said off-line test station on-line and thereby making the off-line test station an on-line test station.

2. The tester of claim 1, wherein said initiating means further comprises means for initiating testing of a plurality of electronic devices at said on-line test station.

3. The tester of claim 1, wherein:
    said initiating means further comprises means for initiating testing of an electronic device only at each of a plurality of on-line test stations; and
    said receiving means further comprises means for receiving results of said testing from each of said on-line test stations.

4. The tester of claim 1 further comprising means for maintaining an identification of a plurality of on-line test stations, wherein:
    said initiating means further comprises means for initiating testing of an electronic device only at each of said plurality of on-line test stations; and
    said receiving means further comprises means for receiving results of said testing from each of said plurality of on-line test stations.

5. The tester of claim 4, wherein said adding means brings said off-line test station on-line after said initiating means initiates testing of an electronic device at least one of said plurality of on-line test stations but before said receiving means receives results of said testing of said electronic device at said at least one of said plurality of on-line test stations.

6. The tester of claim 3 further comprising means for taking one of said on-line test stations off-line.

7. The tester of claim 1 further comprising means for signaling another tester that results of testing have been received from said test station.

8. The tester of claim 1 further comprising means for receiving a signal from another tester that testing of said electronic device by said other tester is completed, wherein said initiating means initiates said testing in response to said signal from said other tester.

9. The tester of claim 1, wherein said test station comprises a prober and said electronic device comprises an unsingulated semiconductor wafer.

10. The tester of claim 1, wherein said electronic device comprises a packaged semiconductor die.

11. The tester of claim 1, wherein said electronic device comprises a singulated, unpackaged semiconductor die.

12. The tester of claim 1, wherein said electronic device comprises a multi-chip module.

13. The tester of claim 1, wherein said initiating means comprises a digital storage device and a digital processor configured to operate in accordance with instructions stored in said digital storage device.

14. The tester of claim 1, wherein said initiating means initiates said testing by wirelessly sending to said on-line test station test data comprising at least one test vector comprising data and locations to which said data is to be written.

15. The tester of claim 14, wherein said locations comprise identifications of probes through which said test data is to be written to said electronic device.

16. The tester of claim 1, wherein said request from an off-line test station comprises data identifying the off-line test station and data identifying a type of an electronic device at said off-line test station that is to be tested.

17. The tester of claim 1, wherein said adding means brings said off-line test station on-line by storing data at said tester identifying said off-line tester as being on-line.

18. The tester of claim 1, wherein said initiating means is not configured to initiate testing of an electronic device at an off-line tester.

* * * * *